United States Patent
Gray et al.

(10) Patent No.: US 6,191,557 B1
(45) Date of Patent: Feb. 20, 2001

(54) DUAL-MODE FUEL GAUGE FOR DISPLAY IN BATTERY-POWERED EQUIPMENT

(75) Inventors: James M. Gray, Fox Point; David L. Schieble, Oconomowoc, both of WI (US)

(73) Assignee: GE Marquette Medical Systems, Inc., Milwaukee, WI (US)

( * ) Notice: Under 35 U.S.C. 154(b), the term of this patent shall be extended for 0 days.

(21) Appl. No.: 09/435,164

(22) Filed: Nov. 5, 1999

(51) Int. Cl.[7] .................................. H02J 7/00; H02J 7/14
(52) U.S. Cl. ..................... 320/132; 320/162; 324/427; 702/63; 600/513
(58) Field of Search ........................... 320/132, 162, 320/34, 136; 324/427, 432, 433; 702/63; 600/513

(56) References Cited

U.S. PATENT DOCUMENTS

| | | | |
|---|---|---|---|
| 5,600,230 | * 2/1997 | Dunstan | 340/636 |
| 5,919,141 | * 7/1999 | Money et al. | 600/513 |
| 6,061,638 | * 5/2000 | Joyce | 702/63 |

* cited by examiner

Primary Examiner—Peter S. Wong
Assistant Examiner—Gregory J. Toatley, Jr.
(74) Attorney, Agent, or Firm—Dennis M. Flaherty; Christian G. Cabou; Phyllis Y. Price

(57) ABSTRACT

A method and an apparatus for informing a system user of the remaining battery terminal voltage as the battery approaches the fully discharged condition. One horizontal fuel gauge icon for each battery is displayed on the host system display panel. The fuel gauge is displayed as two overlapping rectangles which are left justified. The first layer is a solid outline, always the same width, representing the full charge capacity of the battery. The second layer is a filled-in rectangle representing the present (actual) charge capacity as a percentage of the full charge capacity in a charge depletion mode and representing the battery terminal voltage in a voltage mode. The fuel gauging switches from the charge depletion mode to the voltage mode is response to detection of a battery terminal voltage threshold greater than a shutdown voltage threshold.

14 Claims, 6 Drawing Sheets

DUAL-MODE FUEL GAUGE FOR DISPLAY IN BATTERY-POWERED EQUIPMENT

FIELD OF THE INVENTION

This invention generally relates to portable battery-powered equipment. In particular, the invention relates to methods and apparatus for displaying a fuel gauge icon representing the state of a battery in battery-powered equipment.

BACKGROUND OF THE INVENTION

When providing medical care to patients, it is frequently necessary to monitor the patient using medical diagnostic instruments. One type of instrument, the patient monitor, is capable of monitoring the patient to acquire electrocardiogram data, cardiac output data, respiration data, pulse oximetry data, blood pressure data, temperature data and other parameter data. In particular, lightweight portable monitors exist which can be moved with the patient, allowing continuous monitoring during patient transport.

To facilitate monitoring at remote locations or during patient transport, modern portable patient monitors are powered by rechargeable batteries. Extended-use batteries, with quick recharge times, help maximize monitor availability. Advanced monitors have a smart battery management system which maximizes battery life, reducing maintenance and replacement. Such monitors use smart batteries which can be interrogated to obtain data representing the ongoing state of the battery, e.g., the current charge capacity and battery terminal voltage.

Portable patient monitors with integral battery power supply are commercially available in a compact, ergonomic package which allows easy handling. The compact design is achieved in part through the use of flat display panels. The color or monochrome screen accommodates all numerics and multiple waveforms.

In addition to displaying waveforms and numerics representing the data being acquired, advanced patient monitors are able to display a battery fuel gauge icon representing the current charge capacity of a battery. For example, the battery fuel gauge may display a rectangle of pixels having a width proportional to the percentage of the full charge capacity (assumed to be equal to the design capacity) which remains in the battery. If the full width of the displayed fuel gauge is 75 pixels and the charge remaining is 20% of the full charge capacity, then the current charge state can be depicted by displaying a rectangle on the gauge having a width equal to 15 pixels (i.e., 20% of 75 pixels).

Users of portable battery-powered equipment need to have a dependable means of determining the present condition (state of charge) of the batteries installed in the system. Portable equipment with high-capacity batteries can be capable of very long run times. Some users of the equipment frequently use only a small percentage of this capability, but occasionally can require the equipment to deliver the full run time capability. This type of use profile, along with other contributing factors, such as transient pulsatile loads and electronic circuit errors (circuit tolerances), can cause the electronic charge capacity gauging internal to the smart battery to become inaccurate. This error can result in the smart battery reporting a remaining charge capacity to the host system which is higher than the charge which the battery can actually deliver.

The foregoing problem is most apparent and critical to the user when the actual remaining battery charge capacity is low. With no additional correction means, the charge capacity gauging internal to the smart battery can lead the user to believe that charge remains in the battery when in reality the battery is fully depleted. In this case, the equipment will automatically and unexpectedly shut down. In addition, the charge capacity gauging internal to the smart battery is a very poor indicator of both run time remaining and the rate of decline in the capacity of the battery to power the host system when the battery is nearing a fully discharged condition. The error in the battery charge capacity gauging is relatively small when the battery has a relatively large remaining charge capacity; however, this error becomes unacceptably large as the percentage of the battery charge capacity remaining approaches the percentage of accumulated error in the charge capacity gauging.

Thus there is a need for a method of giving the system user a relative "feel" for the rate of decline in a battery's capability to power a system when the battery is near the fully discharged condition. There is also a need for a method of giving the user a positive point at the end of the fuel gauge where the unit will dependably shut down.

SUMMARY OF THE INVENTION

The present invention is a method and an apparatus for changing the mode of operation of the bar graph fuel gauge icon when the battery crosses a predetermined threshold preceding a fully discharged state. From the time when the battery crosses that predetermined threshold until the time of full discharge, the battery will herein be deemed to be in a so-called "soft" condition. A battery entering the soft condition can be identified by detecting that the battery terminal voltage has declined to a battery soft voltage threshold that is on the so-called "knee" of the battery discharge voltage characteristic curve. This point also has an approximate equipment remaining run time value associated with it. At the point corresponding to the predetermined voltage threshold, the fuel gauge icon mode of operation is seamlessly changed so that the pixels displayed represent the proportional battery terminal voltage instead of the remaining charge capacity as a percentage of the full charge capacity. In particular, the voltage range from the predetermined voltage threshold down to the battery full discharge cutoff (shutdown) voltage is scaled into the remaining charge capacity active pixel space. This display mode gives the user a relative "feel" for the rate of decline in the battery's capability to power the system as well as a positive point at the end of the fuel gauge where the unit will dependably shut down.

In accordance with the preferred embodiment of the invention, the bar graph fuel gauge icon is displayed as two overlapping rectangles which are left (or right) justified. The first layer is a solid outline, always the same width, representing the full charge capacity of the battery. The second layer is a filled-in rectangle representing the present (actual) charge capacity in the charge depletion mode or the battery terminal voltage in the voltage mode. The charge depletion mode is active when the battery has significant charge capacity remaining and the battery discharge voltage characteristic is very flat. Under these circumstances, accumulated errors in the charge depletion mode fuel gauging are less significant while the voltage mode fuel gauging is impractical.

It should be appreciated that the invention is not limited to a particular voltage threshold. It is only necessary to select a voltage threshold for a particular battery that will cause the voltage mode to be activated at the desired point on the battery discharge voltage characteristic curve. That curve will vary from battery to battery, as will the voltage threshold level.

In accordance with the preferred embodiment, a central processing unit (CPU) of a patient monitor interrogates a microprocessor of a smart battery via a serial data bus to obtain feedback concerning the full and current charge capacities and the terminal voltage of that battery. The charge capacity and terminal voltage values are stored in respective registers in the smart battery microprocessor. Using the polled information, the host system CPU constructs a fuel gauge having an indicator representing the battery current charge capacity when the fuel gauging is in the charge depletion mode and constructs a fuel gauge having an indicator representing the battery terminal voltage when the fuel gauging is in the voltage mode. The newly constructed fuel gauge is then sent to the display controller, which causes the desired fuel gauge icon to be displayed on the display panel.

The invention is preferably implemented completely in software. However, the person skilled in the art will readily appreciate that the invention could also be implemented as hardware or as a dedicated programmable processor.

Furthermore, although the preferred embodiment disclosed herein is incorporated in a battery-powered portable patient monitor, the invention has application in any battery-powered equipment having a processor and a display panel. The invention could even be incorporated into a smart battery pack having a display device, which need only be large enough to display a bar graph fuel gauge icon. Such a smart battery pack would be particularly useful in battery-powered equipment which does not have a display panel.

DETAILED DESCRIPTION OF THE PREFERRED EMBODIMENTS

Although the present invention is directed to a method and an apparatus for displaying a fuel gauge icon in any battery-powered equipment having display means, the preferred embodiment is disclosed with reference to a portable patient monitor. A general description of the structure and function of such a patient monitor is provided for the sake of completeness.

Figure 1:
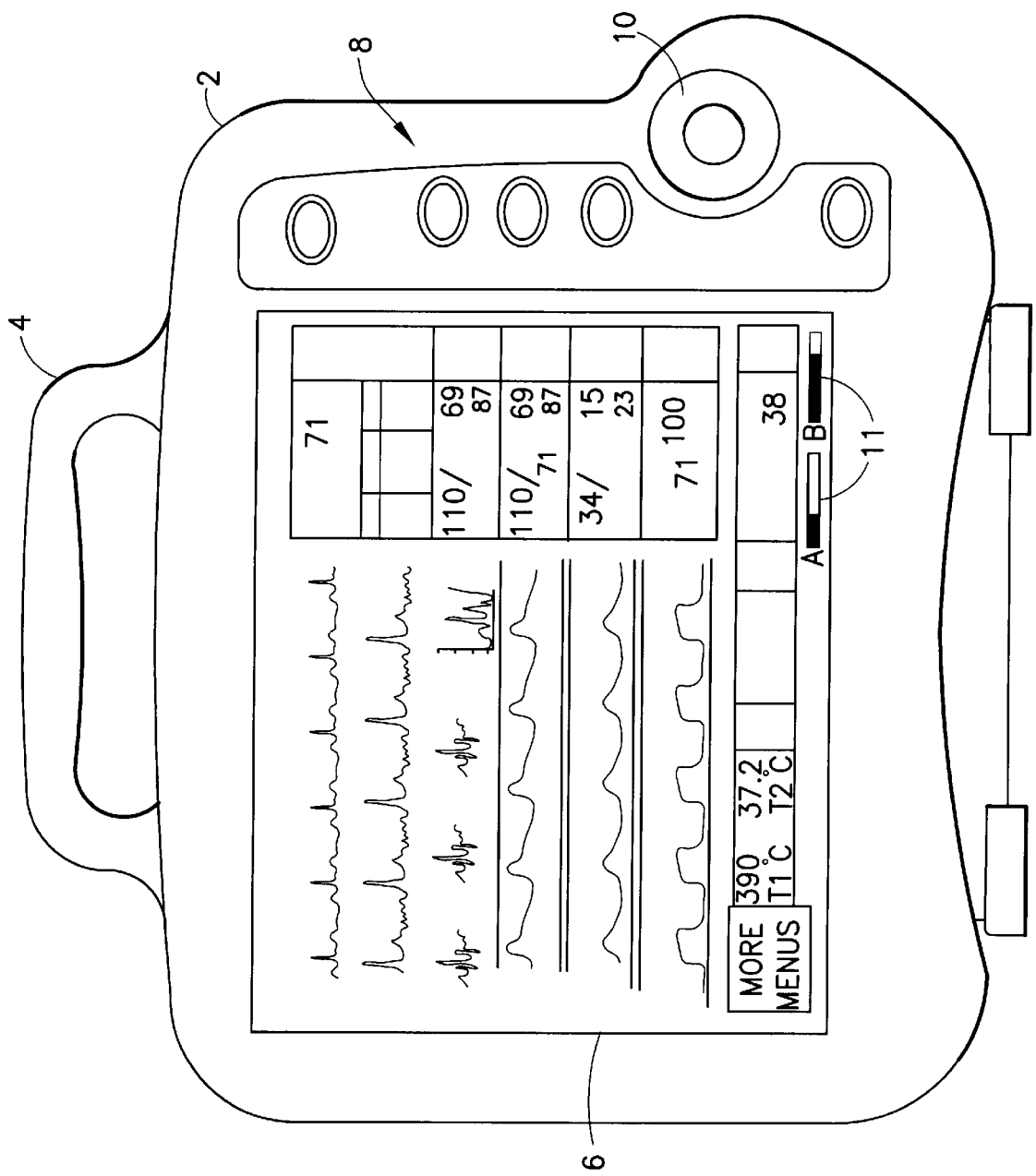
FIG. 1 is a schematic showing a generally frontal view of one commercially available portable patient monitor having a conventional bar graph fuel gauge icon displayed on its display panel.
Figure 2:
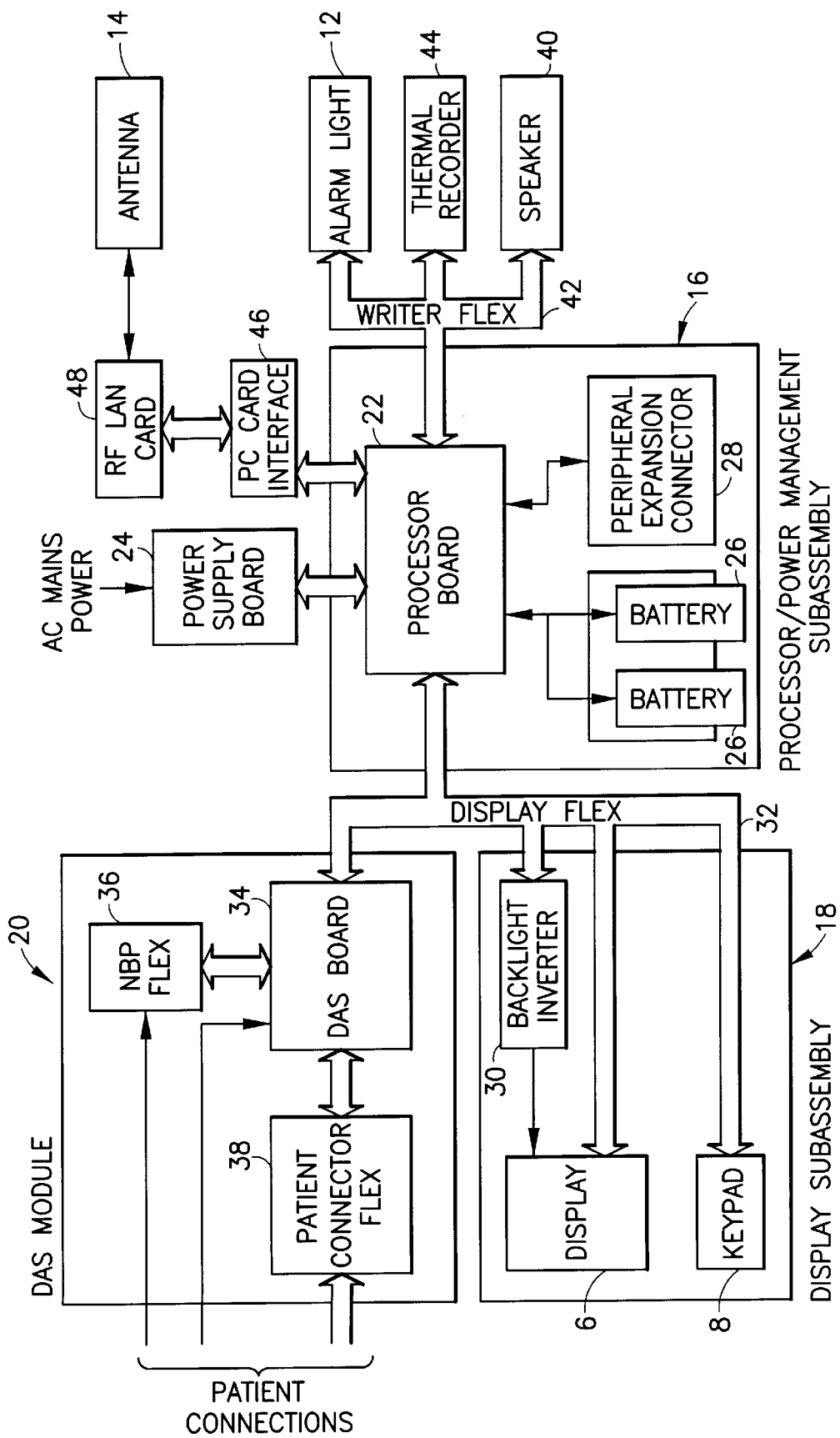
FIG. 2 is a block diagram showing the construction of one type of patient monitor in which the present invention can be incorporated.

A known portable patient monitor, depicted in FIGS. 1 and 2, comprises a housing 2 and a handle 4 connected to the top of the housing. A flat display panel 6 is secured in a generally rectangular window formed in the front face of the housing 2. An operator interface comprising a plurality of keys, forming a keypad 8, and a so-called "trim" knob 10, which allows the user to select and focus on a particular menu. The display panel 6 displays waveforms and numerical data. The status of a pair of batteries A and B is respectively indicated by a pair of bar graph fuel gauge icons 11 in the lower right-hand corner of the display panel 6. The conventional bar graph fuel gauge icon displays a first layer comprising a solid outline representing the full charge capacity and a second layer comprising a filled-in rectangle representing the current charge capacity.

The portable battery-powered patient monitor shown in FIG. 1 incorporates two smart batteries, as indicated by the corresponding fuel gauge icons. However, the present invention can be used in conjunction with a single smart battery or more than two batteries. A separate fuel gauge icon in accordance with the preferred embodiment will be displayed for each smart battery in place of the conventional fuel gauge icons depicted in FIG. 1. As used herein, the term "smart battery" means a subsystem comprising a dc voltage source and a register for storing a parameter value (e.g., charge capacity) of that dc voltage source.

Referring to FIG. 2, the patient monitor comprises a patient transport. The processor/power management subassembly 16, a display subassembly 18 and a data acquisition system module 20.

The processor/power management subassembly 16 comprises a processor board 22 which can be powered by an ac mains power supply via a power supply board 24. Alternatively, the processor board 22 can be powered by rechargeable smart batteries 26 when the patient monitor is disconnected from the mains powersupply, e.g., during patient transport. The processor/power management subassembly 16 further comprises a peripheral expansion connector 28, wich allows the processor to communicate with peripheral processors added as the result of future expansion of the system.

The display subassembly 18 comprises a liquid-crystal display (LCD) flat panel 6, a backlight inverter 30 for powering the fluorescent tubes of the flat display panel and a keypad 8 for operator inputs. The flat display panel 6, the backlight inverter 30 and the keypad 8 are electrically coupled to the processor board 22 via a display flexible printed circuit board (flex) 32.

The data acquisition system (DAS) module 20 comprises a plurality of ports for patient connections and a DAS board 34. The patient connection for acquiring noninvasive blood pressure (NBP) data is coupled to the DAS board 34 via an NBP flex 36. The leads for acquiring electrocardiogram (ECG), respiratory and other cardiovascular data are coupled to the DAS board 34 via a patient connector flex 38. The ECG leads connect to electrodes attached to the patient's chest. The acquired data is sent to the processor board 22 for signal processing and analysis via the display flex 32. The processor board 22 controls the display panel 6 to display the desired waveforms and numerical data based on the acquired data received from the DAS board 34.

In addition to displaying acquired data, the patient monitor depicted in FIG. 2 also has the capability of automatically activating audible and visual alarms in response to acquired data exceeding a preset alarm threshold. The alarm thresholds are user-selectable via keypad entries. The visual alarm indicator is an alarm light 12 which flashes when activated; the audible indicator is an audio speaker 40 which emits alarm tones when activated. The alarm light 14 and audio speaker 40 are controlled by the processor board 22 via a writer flex 42. The processor board 22 also controls a thermal recorder 44 via the writer flex 42. The thermal recorder 44 serves to create a written record of selected data readings.

Also the patient monitor can communicate wirelessly with a local area network (LAN) using an antenna 14. The processor board 22 sends signals to and receives signals from the antenna 14 via a PC card interface 46 which interfaces with a RF LAN card 48. The PC card interface 46 plugs into a socket which resides on the processor board 22.

As previously described, the patient monitor shown in FIGS. 1 and 2 has two smart batteries 26. In accordance with the preferred embodiment of the invention, a respective fuel gauge icon 11 (see FIG. 1) is displayed on the display panel 6 for each battery. These icons are labeled A and B to designate the respective batteries. During operation in the battery mode, if neither battery is in a so-called "soft" condition, then initially the patient monitor will receive dc voltage from battery A. As used herein, the term "soft" condition means that the battery voltage has reached or crossed a threshold voltage level which is more than the shutdown voltage by a predetermined amount. (The shutdown voltage is the voltage at which the smart battery issues an alarm signal and resets its charge capacity register to zero to indicate that the battery is fully discharged.) To identify a battery entering the "soft" condition, the system CPU detects when the battery terminal voltage declines to a battery soft voltage threshold that is on the "knee" of the battery discharge voltage characteristic curve. This point also has an approximate equipment remaining run time value associated with it. When battery A becomes "soft", the host system switches to battery B. When battery B also becomes "soft", the host system re-couples to battery A while maintaining its coupling to battery B. The host system shuts down upon receipt of shutdown alarm signals from both batteries.

Figure 4:
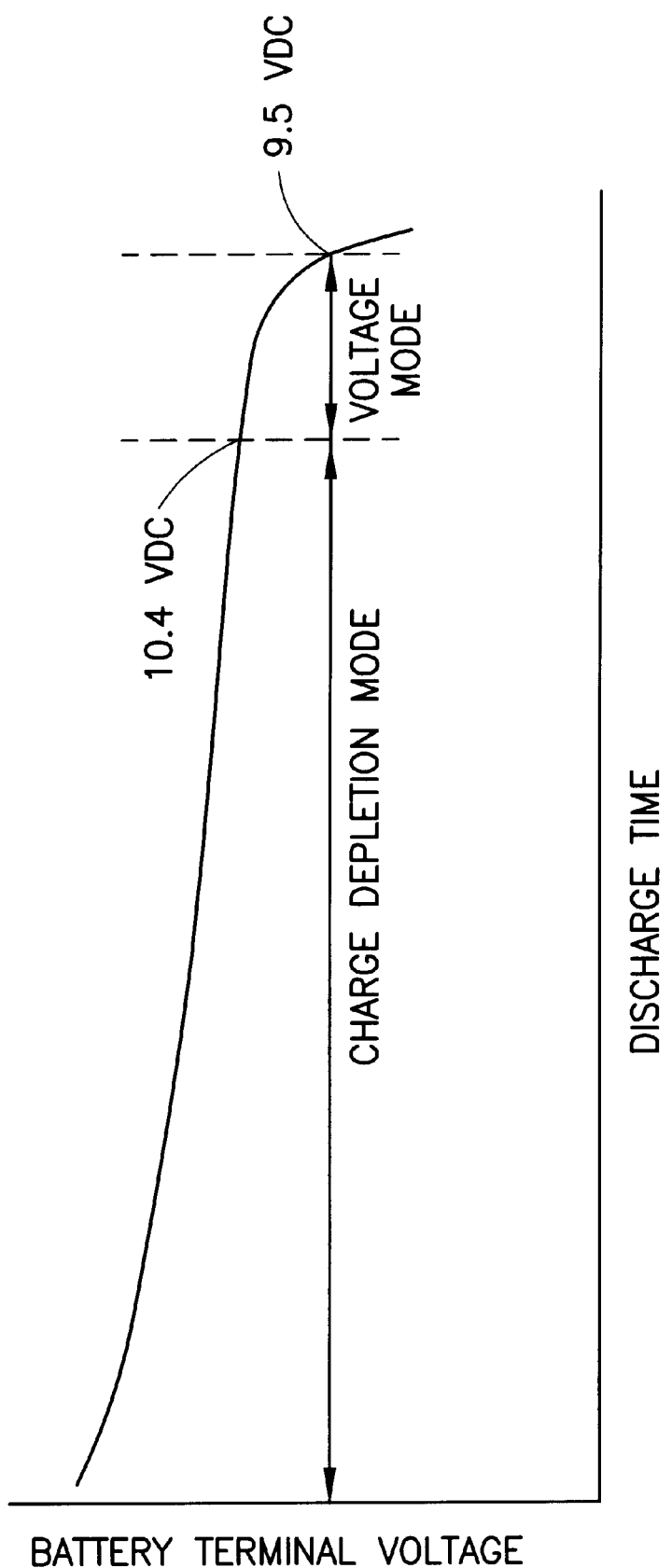
FIG. 4 is a graph of the terminal voltage versus the discharge time for a typical battery, i.e., a battery having a nominal terminal voltage of 10.8 volts (dc).

A battery terminal voltage versus discharge time curve for a typical battery having a nominal dc voltage of 10.8 volts is shown in FIG. 4. The so-called "knee" of the curve lies between the parallel dashed lines. The leftmost dashed line corresponds to the soft voltage threshold, which in this example is 10.4 volts (dc). The rightmost dashed line corresponds to the shutdown voltage threshold, which in this example is 9.5 volts (dc). In accordance with this particular example of a preferred embodiment, the fuel gauging will switch from the charge depletion mode to the voltage mode when the battery terminal voltage reaches the soft voltage threshold. The fuel gauging will remain in the voltage mode until the battery is fully discharged, i.e., until the shutdown voltage threshold is reached. At the latter point, the fuel gauge will indicate zero charge in the battery and the host system will shut down.

The present invention provides a method and means for displaying graphical information representing the current charge capacity of the battery when the fuel gauging is in the charge depletion mode and graphical information representing the terminal voltage of the battery when the fuel gauging is in the voltage mode. In the charge depletion mode, the indicator on the fuel gauge icon represents the current charge capacity of the battery as a percentage of or in proportion to the full charge capacity. In the voltage mode, the indicator on the fuel gauge icon will be a function of (e.g., proportional to) the battery terminal voltage as it decreases starting at the soft voltage threshold and continuing to the shutdown voltage threshold.

Figure 3:
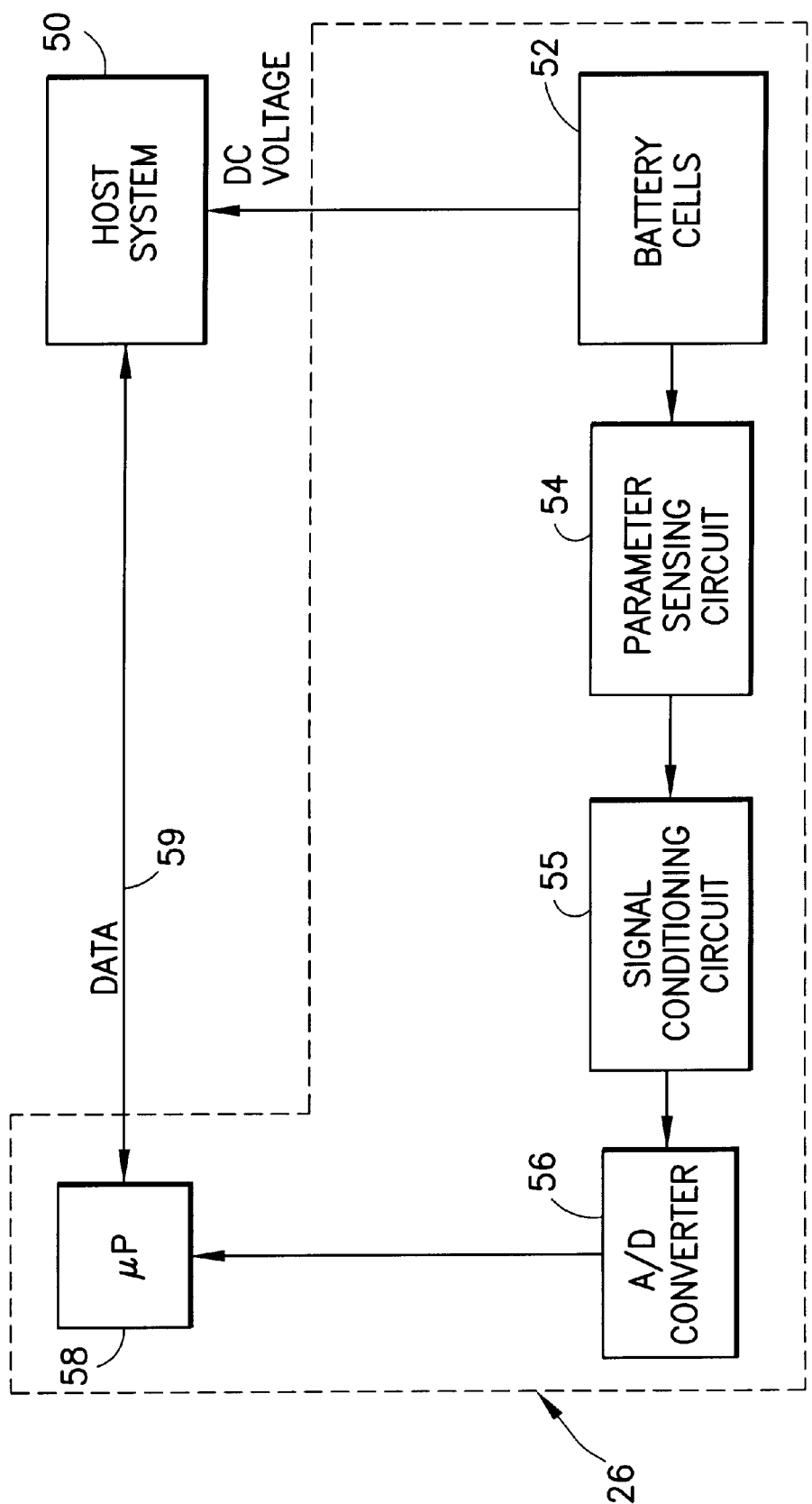
FIG. 3 is a block diagram generally depicting a conventional smart battery connected to a host system such as the patient monitor of FIG. 2.

In the preferred embodiment shown in FIG. 3, the host system 50 (e.g., a patient monitor of the type shown in FIGS. 1 and 2) receives dc voltage from the battery cells 52 of a smart battery. The smart battery further comprises a parameter sensing circuit 54 for acquiring analog signals representing various parameters of the battery cells, such as current charge capacity and battery terminal voltage; a signal conditioning circuit 55 for conditioning the signals output by the parameter sensing circuit 54; an analog-to-digital (A/D) converter 56 for converting the analog values from the signal conditioning circuit 55 into digital values; and a microprocessor 58 which has registers for storing the full and current charge capacity values and the battery terminal voltage from the A/D converter 56. In accordance with the preferred embodiment of the invention, the host system 50 periodically interrogates the microprocessor 58 via a two-wire (one data line and one clock line) serial data bus 59. In response to such interrogation, the smart battery microprocessor 58 reads out the full and current charge capacity values or the battery terminal voltage value stored in its internal registers and transmits those values to the host system 50 via the same serial data bus 59.

Based on the battery-specific parameters received from the interrogated microprocessor, the host system then constructs a fuel gauge icon and displays it on the display panel to represent the current status of the battery. The preferred embodiment of the fuel gauge icon, as displayed, is depicted in the bottom portion of FIG. 5. A similarly constructed fuel gauge icon is displayed for each battery. The fuel gauge 11 is displayed as two overlapping rectangles which are left justified. The first layer is a solid outline 74, always the same width, representing the full charge capacity of the battery. The second layer is a filled-in rectangle 76 representing the current battery charge capacity when the fuel gauge is in the charge depletion mode and representing the current battery terminal voltage when the fuel gauge is in the voltage mode. The fuel gauging switches from the charge depletion mode to the voltage mode is response to detection of a battery terminal voltage threshold greater than a shutdown voltage threshold.

Figure 5:
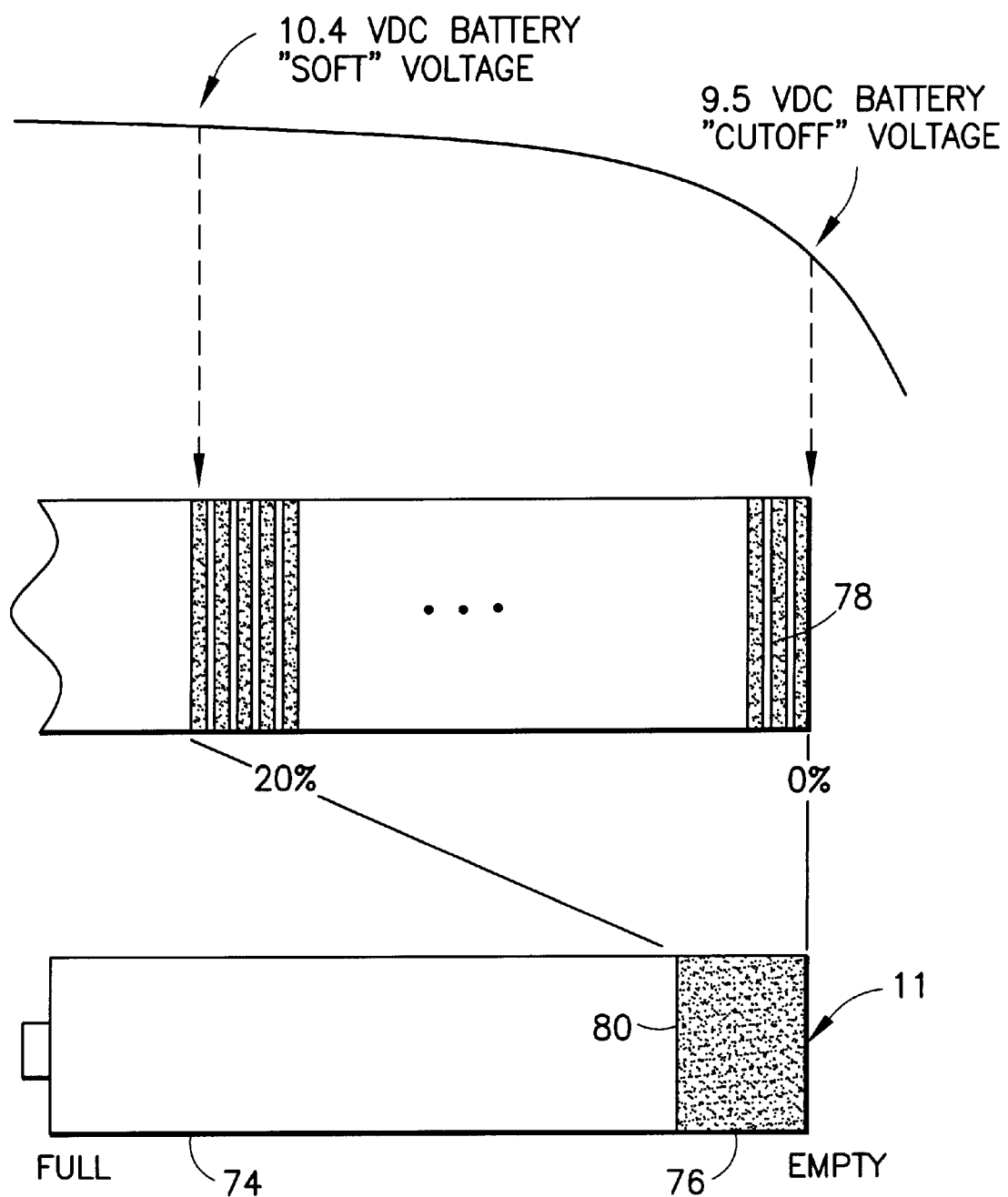
FIG. 5 is a schematic showing the fuel gauge in the voltage mode in accordance with the preferred embodiment in relation to a portion of the battery voltage discharge characteristic curve shown in FIG. 4.

For example, assume that the host system is running from a battery having a full charge capacity equal to its design charge capacity and that the relative state of the current charge capacity is 20% at the soft voltage shown in FIG. 5. If the full width of the fuel gauge icon 74 is 75 pixels, then the width of the filled-in rectangle 76 will be 15 pixels. These pixels are designated with the reference numeral 78 in the expanded bar graph aligned below the battery voltage discharge characteristic curve shown in FIG. 5. The side 80 of the filled-in rectangle indicates the voltage level. The width of the rectangle is scaled to the voltage range from the soft voltage to the shutdown voltage. For example, for the case where the length of the fuel gauge icon is N pixels and the voltage mode is activated at a current capacity of 20%, i.e., 0.2N pixels, then turning off the leftmost column of pixels will represent a decrease of (10.4−9.5)/0.2N=0.9/0.2N=4.5/N volts in the indicated battery terminal voltage.

In the charge depletion mode, the filled-in rectangle 76 has a width equal to a number of pixels roughly proportional to the current charge capacity. For example, assume that the dashed rectangle representing the design charge capacity is 75 pixels wide. Then, if the full charge capacity is 80% of the design charge capacity, the filled-in rectangle 76 which is superimposed on the 75-pixel-wide solid rectangle 74) will be 60 pixels wide.

Figure 6:
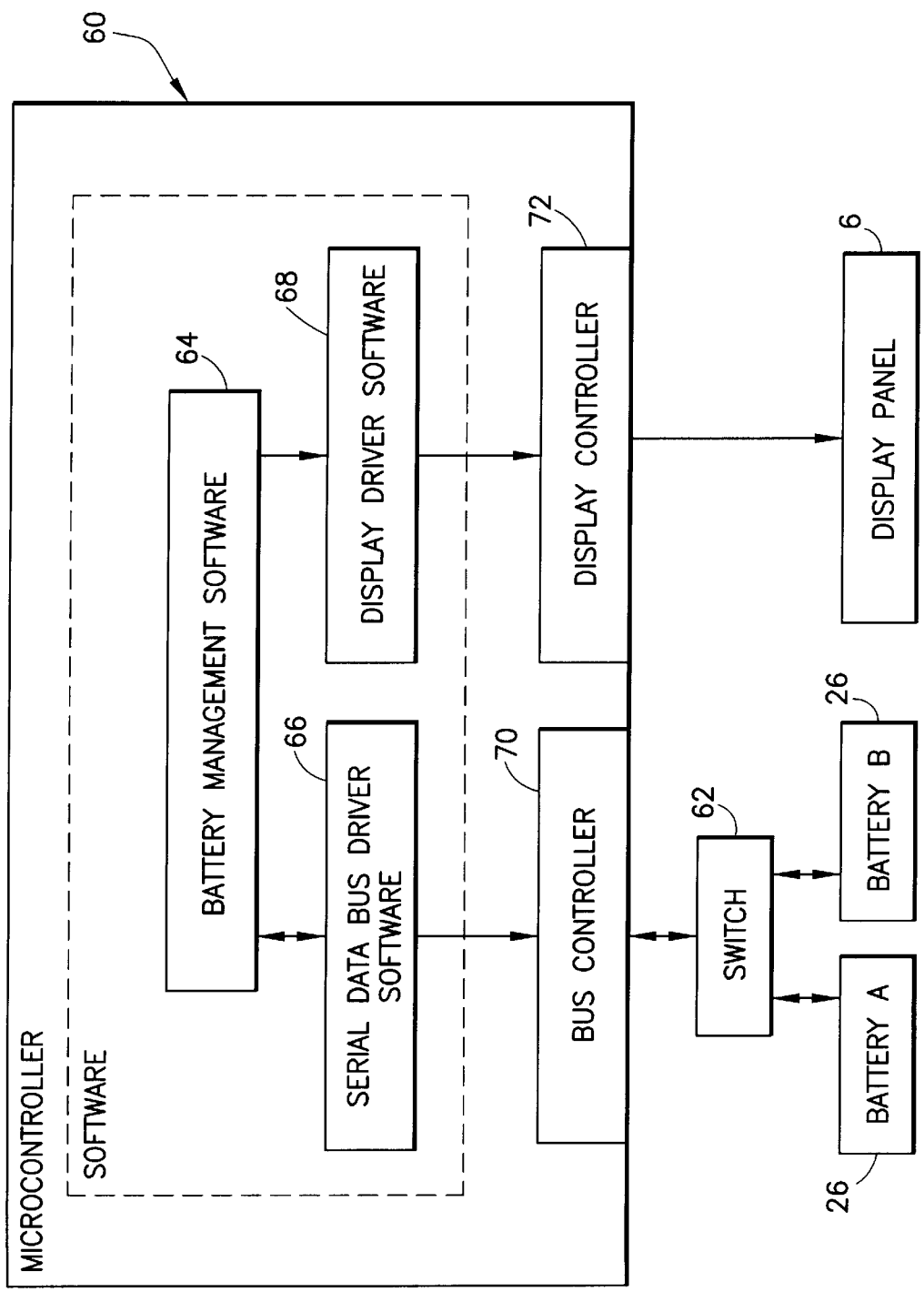
FIG. 6 is a block diagram showing parts of a battery-powered patient monitor in accordance with a preferred embodiment of the invention.

In accordance with the preferred embodiment shown in FIG. 6, the host system is powered by a pair of smart batteries of the type generally depicted in FIG. 3.

Preferably the host system has a central processing unit (CPU) 60 (e.g., a microcontroller) which is programmed to the perform the steps of interrogating each battery to obtain its full charge capacity, current charge capacity and battery terminal voltage; and then controlling the display panel to display a fuel gauge icon comprising respective indicators representing the full charge capacity and current charge capacity retrieved from each battery in the charge depletion mode and representing the battery terminal voltage retrieved from each battery in the voltage mode. The CPU 60 interrogates each battery 26 via a two-wire serial data bus which incorporates a switch 62. In a first switch state, the CPU 60 interrogates battery A via switch 62; in a second switch state, the CPU 60 interrogates battery B via switch 62. The CPU 60 is programmed with battery management software 64 which interrogates the smart batteries and then constructs the fuel gauge icons to be displayed on the display panel. The interrogation of the batteries is facilitated by serial data bus driver software 66, which controls operation of a built-in bus controller 70 of the CPU 60. Preferably, the serial data bus driver software 66 and bus controller 70 conform to the I2C protocol, which is an industry standard. The two-wire serial data bus, known as the SMBus, is an extension of the I2C bus and is also an industry standard.

The full charge capacity, current charge capacity and battery terminal voltage are battery-specific parameters maintained within each battery 26. The battery management software 64 merely issues a request for these values and receives a response from the interrogated battery, all via the SMBus. Then the fuel gauge icon is constructed by the battery management software 64 and sent to the display panel 6. The battery management software 64 draws each fuel gauge icon by drawing two different rectangles (e.g., a solid outline and a filled-in rectangle), left justified and superimposed on one other. The battery management software 64 is responsible for recalculating the size of each rectangle every second based on new data from the battery. The battery management software then sends these sizes to the display driver software 68, which uses the built-in display controller 72 of the CPU 60.

While the invention has been described with reference to preferred embodiments, it will be understood by those skilled in the art that various changes may be made and equivalents may be substituted for elements thereof without departing from the scope of the invention. For example, it is obvious to a person skilled in the art that a solid or dashed line can be used to indicate the current battery terminal voltage on the fuel gauge icon, instead of a filled-in rectangle. In this case, the solid or dashed line would be situated at the same position as the side 80 of the filled-in rectangle shown in FIG. 5. Nor does the invention require that the fuel gauge icon be constructed using rectangles. Other geometric shapes can also be used. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

What is claimed is:

1. An apparatus comprising:
    a smart battery comprising a battery and memory for storing a first value representing a current charge capacity and a second value representing a terminal voltage of said battery;
    a display panel; and
    a processor for controlling said display panel to display a gauge comprising an indicator representing said first value in a charge depletion mode or an indicator representing said second value in a voltage mode,
    wherein said processor comprises means for switching from said charge depletion mode to said voltage mode when said terminal voltage reaches a predetermined threshold.

2. The apparatus as recited in claim 1, wherein said indicator comprises a filled-in rectangle.

3. The apparatus as recited in claim 2, wherein said filled-in rectangle has a width equal to a number of pixels roughly proportional to said terminal voltage.

4. The apparatus as recited in claim 1, further comprising means for interrogating said smart battery and means for acquiring one or both of said first and second values in response to said interrogation.

5. An apparatus comprising:
    a smart battery comprising a battery having a terminal voltage and a current charge capacity, means for acquiring a first value representing the current charge capacity of said battery, and means for acquiring a second value representing the terminal voltage of said battery;
    a display panel; and
    a processor for controlling said display panel to display a gauge comprising an indicator representing said first value in a charge depletion mode or an indicator representing said second value in a voltage mode,
    wherein said processor comprises means for switching from said charge depletion mode to said voltage mode when said terminal voltage reaches a predetermined threshold.

6. An apparatus comprising:
    a smart battery having a current charge capacity and a terminal voltage;
    a display panel; and
    a computer programmed to perform the steps of controlling said display panel to display a gauge comprising an indicator representing said current charge capacity of said smart battery in a charge depletion mode or an indicator representing said terminal voltage of said smart battery in a voltage mode, and switching from said charge depletion mode to said voltage mode when said terminal voltage reaches a predetermined threshold.

7. The apparatus as recited in claim 6, wherein said computer is further programmed to perform the steps of interrogating said smart battery to obtain said terminal voltage and said current charge capacity.

8. The apparatus as recited in claim 6, wherein said indicator comprises a filled-in rectangle.

9. The apparatus as recited in claim 8, wherein said filled-in rectangle has a width equal to a number of pixels roughly proportional to said terminal voltage.

10. A patient monitor incorporating an apparatus as recited in claim 6.

11. A method of displaying a gauge representing the state of a battery, comprising the steps of:
    calculating electronic data representing a gauge comprising an indicator representing a current charge capacity of the battery in a charge depletion mode or an indicator representing a terminal voltage of the battery in a voltage mode;
    displaying said electronic data on a display panel; and
    switching from said charge depletion mode to said voltage mode when said terminal voltage reaches a predetermined threshold.

12. The method as recited in claim 11, further comprising the steps of interrogating the battery to obtain said terminal voltage and said current charge capacity.

13. A method of displaying a gauge representing the state of a battery, comprising the steps of:
- calculating electronic data representing a gauge comprising an indicator representing a current charge capacity of the battery in a charge depletion mode or an indicator representing a terminal voltage of the battery in a voltage mode;
- displaying said electronic data on a display panel; and
- scaling a portion of the width of said gauge to a difference between a predetermined voltage threshold and a predetermined shutdown voltage.

14. An apparatus comprising:
- a smart battery having a current charge capacity and a terminal voltage;
- a display panel; and
- a computer programmed to perform the steps of controlling said display panel to display a gauge comprising an indicator representing said current charge capacity of said smart battery in a charge depletion mode or an indicator representing said terminal voltage of said smart battery in a voltage mode, and scaling a portion of the width of said gauge to a difference between a predetermined voltage threshold and a predetermined shutdown voltage.

* * * * *